(12) United States Patent
Lee et al.

(10) Patent No.: US 9,467,119 B2
(45) Date of Patent: Oct. 11, 2016

(54) MULTI-MODE POINTING DEVICE AND METHOD FOR OPERATING A MULTI-MODE POINTING DEVICE

(75) Inventors: Min Sup Lee, Seoul (KR); Jae Kyung Lee, Seoul (KR); Kun Sik Lee, Seoul (KR); Gyu Seung Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 379 days.

(21) Appl. No.: 12/783,970

(22) Filed: May 20, 2010

(65) Prior Publication Data

US 2010/0302154 A1 Dec. 2, 2010

(30) Foreign Application Priority Data

May 29, 2009 (KR) .................. 10-2009-0047660

(51) Int. Cl.
*G06F 3/0346* (2013.01)
*G09G 5/08* (2006.01)
*H03J 1/00* (2006.01)

(52) U.S. Cl.
CPC ........... *H03J 1/0025* (2013.01); *G06F 3/0346* (2013.01); *G08C 2201/20* (2013.01); *G08C 2201/32* (2013.01)

(58) Field of Classification Search
CPC .. G08C 17/02; G08C 23/04; G08C 2201/20; G08C 2201/32; G08C 2201/90–2201/92; H03J 2200/22; H04N 5/4403; H04N 21/42207; H04N 21/42221; H04N 2005/4407; H04N 2005/4426; G06F 3/046; G06F 2203/0384
USPC ................. 345/156, 158; 348/734; 340/12.22–12.55
See application file for complete search history.

(56) References Cited

U.S. PATENT DOCUMENTS

| 5,500,691 | A | 3/1996 | Martin et al. ............... 348/734 |
| 5,545,857 | A | 8/1996 | Lee et al. |
| 6,407,779 | B1* | 6/2002 | Herz ............................. 348/734 |
| 6,704,346 | B1* | 3/2004 | Mansfield ..................... 375/136 |
| 6,812,881 | B1* | 11/2004 | Mullaly et al. ............... 341/176 |
| 7,747,077 | B2 | 6/2010 | Murakami |
| 7,769,370 | B2 | 8/2010 | Du Breuil et al. |
| 8,259,103 | B2 | 9/2012 | Glueck et al. |
| 8,760,400 | B2 | 6/2014 | Kerr et al. |
| 2002/0113896 | A1* | 8/2002 | Takagi et al. ................ 348/569 |

(Continued)

FOREIGN PATENT DOCUMENTS

| CN | 101341457 | 1/2009 |
| EP | 1 981 012 A2 | 10/2008 |

(Continued)

OTHER PUBLICATIONS

European Search Report for Application 10151466.9 dated May 6, 2010.

(Continued)

*Primary Examiner* — Amr Awad
*Assistant Examiner* — Stephen Bray
(74) *Attorney, Agent, or Firm* — KED & Associates LLP

(57) ABSTRACT

A method for pairing and operating a multi-mode pointing device is provided. A pointing device may be automatically paired with an image display device. A pairing request signal may be transmitted on a prescribed frequency channel, and a signal may be received indicating information of a plurality of frequency channels. One of the frequency channels may be selected as a pairing frequency channel for operating in a radio frequency mode.

26 Claims, 12 Drawing Sheets

(56) References Cited

U.S. PATENT DOCUMENTS

| | | | |
|---|---|---|---|
| 2003/0011638 A1 | 1/2003 | Chung | |
| 2003/0052859 A1 | 3/2003 | Finley | 345/156 |
| 2003/0142139 A1 | 7/2003 | Brown et al. | |
| 2004/0104891 A1* | 6/2004 | Sacca et al. | 345/156 |
| 2005/0105951 A1* | 5/2005 | Risheq | 400/472 |
| 2005/0151886 A1 | 7/2005 | Hirano | |
| 2005/0216867 A1* | 9/2005 | Marvit et al. | 715/863 |
| 2005/0275637 A1 | 12/2005 | Hinckley et al. | |
| 2006/0035590 A1 | 2/2006 | Morris et al. | |
| 2006/0181430 A1* | 8/2006 | Choi et al. | 340/825.72 |
| 2006/0184966 A1 | 8/2006 | Hunleth et al. | |
| 2006/0206835 A1 | 9/2006 | Chaudhri et al. | 715/781 |
| 2006/0214924 A1 | 9/2006 | Kawamoto et al. | 345/173 |
| 2006/0242557 A1 | 10/2006 | Nortis, III | |
| 2007/0019771 A1 | 1/2007 | Ambuehl et al. | |
| 2007/0067798 A1 | 3/2007 | Wroblewski | |
| 2007/0083825 A1 | 4/2007 | Chaudhri et al. | |
| 2007/0106939 A1 | 5/2007 | Qassoudi | 715/704 |
| 2007/0109269 A1 | 5/2007 | Feldmeler | 345/166 |
| 2007/0245256 A1 | 10/2007 | Boss et al. | |
| 2008/0024682 A1 | 1/2008 | Chen | |
| 2008/0150964 A1 | 6/2008 | Cho | 345/629 |
| 2008/0157993 A1* | 7/2008 | Du Breuil | G08C 17/02 340/5.64 |
| 2008/0158155 A1* | 7/2008 | Liberty et al. | 345/158 |
| 2008/0169907 A1* | 7/2008 | Ootsuka | 340/10.1 |
| 2008/0248748 A1 | 10/2008 | Sangster et al. | |
| 2008/0252491 A1 | 10/2008 | De Ruyter et al. | 341/20 |
| 2008/0253772 A1* | 10/2008 | Katsuyama | 398/106 |
| 2009/0045970 A1* | 2/2009 | Miyabayashi et al. | 340/825.22 |
| 2009/0089668 A1 | 4/2009 | Magnani et al. | 715/273 |
| 2009/0089856 A1* | 4/2009 | Bangor et al. | 725/151 |
| 2009/0150224 A1 | 6/2009 | Lu et al. | |
| 2009/0195407 A1* | 8/2009 | Nakano et al. | 340/825.69 |
| 2009/0257379 A1 | 10/2009 | Robinson et al. | |
| 2009/0322676 A1* | 12/2009 | Kerr et al. | 345/158 |
| 2010/0081506 A1 | 4/2010 | Yoshikawa et al. | |
| 2010/0083313 A1 | 4/2010 | White et al. | |
| 2010/0120365 A1* | 5/2010 | Sim et al. | 455/41.3 |
| 2010/0123834 A1 | 5/2010 | Brodersen et al. | 348/734 |
| 2010/0169842 A1 | 7/2010 | Migos | |
| 2010/0181990 A1* | 7/2010 | Hudson et al. | 324/115 |
| 2010/0188429 A1 | 7/2010 | Friedman | 345/661 |
| 2010/0278345 A1* | 11/2010 | Alsina et al. | 380/283 |
| 2010/0305999 A1 | 12/2010 | Fujioka | |
| 2010/0319024 A1 | 12/2010 | Hiraoka | |

FOREIGN PATENT DOCUMENTS

| | | |
|---|---|---|
| JP | 10-083272 | 3/1998 |
| JP | 2009-049590 | 3/2009 |
| KR | 10-2006-0129183 A | 12/2006 |
| KR | 10-2008-0003788 A | 1/2008 |
| KR | 10-2008-0010859 | 1/2008 |
| WO | WO 95/05709 | 2/1995 |
| WO | WO 00/59212 | 10/2000 |
| WO | WO 02/34345 | 5/2002 |
| WO | WO 2004/047440 | 6/2004 |
| WO | WO 2006/088831 | 8/2006 |
| WO | WO 2007/060638 | 5/2007 |
| WO | WO 2008/038883 | 4/2008 |
| WO | WO 2008/084696 | 7/2008 |
| WO | WO 2008/156453 | 12/2008 |
| WO | WO 2009/032998 | 3/2009 |

OTHER PUBLICATIONS

Chinese Office Action dated Dec. 7, 2011 for Application 200910265989.8.
Office Action dated Dec. 28, 2011 for U.S. Appl. No. 12/647,226.
Office Action dated Dec. 29, 2011 for U.S. Appl. No. 12/647,222.
Office Action dated Mar. 15, 2012 for U.S. Appl. No. 12/618,639.
European Search Report dated May 3, 2010.
European Search Report dated May 20, 2010.
Ryan W. Woodings et al., "Rapid Heterogeneous Ad Hoc Connection Establishment: Accelerating Bluetooth Inquiry Using IrDA;" Wireless Communications and Netmorking Conference 2002; WCNC2002. 2002 IEEE, vol. 1, Mar. 17, 2002, pp. 342-349.
European Search Report dated May 7, 2010.
Sung-Jung Cho et al.; "Magic Wand: A Hand-Drawn Gesture Input Device in 3-D Space with Inertial Sensors;" Proceedings of the $9^{th}$ Int'l Workshop on Frontiers in Handwriting Recognition (WFHR-9 2004).
Office Action dated May 23, 2012 for U.S. Appl. No. 12/647,222.
Office Action dated Jun. 18, 2012 for U.S. Appl. No. 12/647,226.
Office Action dated Jul. 17, 2012 for U.S. Appl. No. 12/618,639.
Office Action dated Aug. 1, 2012 for U.S. Appl. No. 12/647,231.
European Search Report for Application 10163855.9 dated Sep. 9, 2010.
Chinese Office Action dated Sep. 15, 2011 for Application200910265992.X and English language translation.
U.S. Office Action dated Mar. 8, 2013 for U.S. Appl. No. 12/647,222.
U.S. Office Action dated Apr. 9, 2013 for U.S. Appl. No. 12/647,231.
Final U.S. Office Action dated Mar. 22, 2013 for U.S. Appl. No. 12/618,639.
Final U.S. Office Action dated Mar. 28, 2013 for U.S. Appl. No. 12/686,150.
Office Action dated Nov. 19, 2012 for U.S. Appl. No. 12/686,150.
Office Action dated Dec. 13, 2012 for U.S. Appl. No. 12/618,639.
United States Office Action dated Aug. 6, 2013 issued in U.S. Appl. No. 12/647,231.
United States Final Office Action dated Oct. 10, 2013 issued in U.S. Appl. No. 12/647,226.
U.S. Office Action for U.S. Appl. No. 12/647,222, dated Jun. 20, 2013.
Office Action for U.S. Appl. No. 12/618,639 dated Nov. 26, 2013.
Office Action for U.S. Appl. No. 12/647,222 dated Dec. 5, 2013.
Notice of Allowance for U.S. Appl. No. 12/647,231 dated Dec. 9, 2013.
U.S. Office Action issued in co-pending U.S. Appl. No. 12/618,639 dated May 29, 2014.
U.S. Office Action issued in co-pending U.S. Appl. No. 12/647,222 dated Jun. 19, 2014.
U.S. Office Action issued in co-pending U.S. Appl. No. 12/647,226 dated Jul. 2, 2014.
European Office Action issued in Application No. 09181026.7 dated Aug. 22, 2014.
U.S. Office Action issued in co-pending U.S. Appl. No. 12/647,222 dated Nov. 28, 2014.
European Search Report for Application 14002213.8 dated Oct. 22, 2014.
European Office Action issued in related Application No. 10151463.6 dated Aug. 4, 2014.
U.S. Office Action issued in co-pending U.S. Appl. No. 12/647,226 dated Oct. 8, 2014.
European Office Action issued in related Application No. 09180765.1 dated Jul. 16, 2014.
U.S. Final Office Action dated May 14, 2015 issued in U.S. Appl. No. 12/647,222.
Korean Office Action issued in application No. 10-2009-0047658 dated Jan. 30, 2015.
U.S. Office Action issued in co-pending U.S. Appl. No. 12/647,226 dated Mar. 13, 2015.
Korean Office Action for Application 10-2009-0047660 dated Jun. 23, 2015.
U.S. Office Action for U.S. Appl. No. 12/647,222 dated Oct. 22, 2015.
U.S. Office Action dated May 5, 2016 issued in U.S. Appl. No. 12/647,222.
Nintendo Wii™ Operations Manual System Setup UK and Ireland, pp. 1-44, copyrighted 2009.

* cited by examiner

MULTI-MODE POINTING DEVICE AND METHOD FOR OPERATING A MULTI-MODE POINTING DEVICE

BACKGROUND

1. Field

Embodiments of the present invention may relate to a multi-mode pointing device, such as a 3-Dimensional (3D) remote controller. More particularly, embodiments of the present invention may relate to a multi-mode pointing device for automatically being paired with an image display device. Also, embodiments of the present invention may relate to a multi-mode pointing device enable of controlling the image display device prior to the pairing.

2. Background

An image display device may display video viewable to a user. The user may view broadcast programs through the image display device. The image display device may display a user-selected broadcast program on a display based on broadcast signals received from broadcasting stations. Broadcasting may be undergoing a transition from analog to digital.

Digital broadcasting may refer to broadcasting digital video and audio signals. Compared to analog broadcasting, digital broadcasting may be characterized by less data loss due to its robustness against external noise, effectiveness in error correction, high resolution, and/or clean and clear images. Digital broadcasting may enable interactive services, unlike analog broadcasting.

As video signals displayable on the image display device increase in type and number and more services are accessible through the image display device, a remote controller may have more buttons (or keys) to operate the image display device. A complex remote controller may cause inconvenience to the user. Accordingly, techniques may be developed including a user interface for efficiently controlling an image display device and increasing user convenience.

A remote control device may transmit a signal to the image display device in compliance with an Infrared Data Association (IrDA) communication standard and the image display device may receive the IrDA signal. Along with diversification of functions of the image display device, signals from the remote control device to the image display device may carry information of various types and the signals may be transmitted based on various communication standards.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
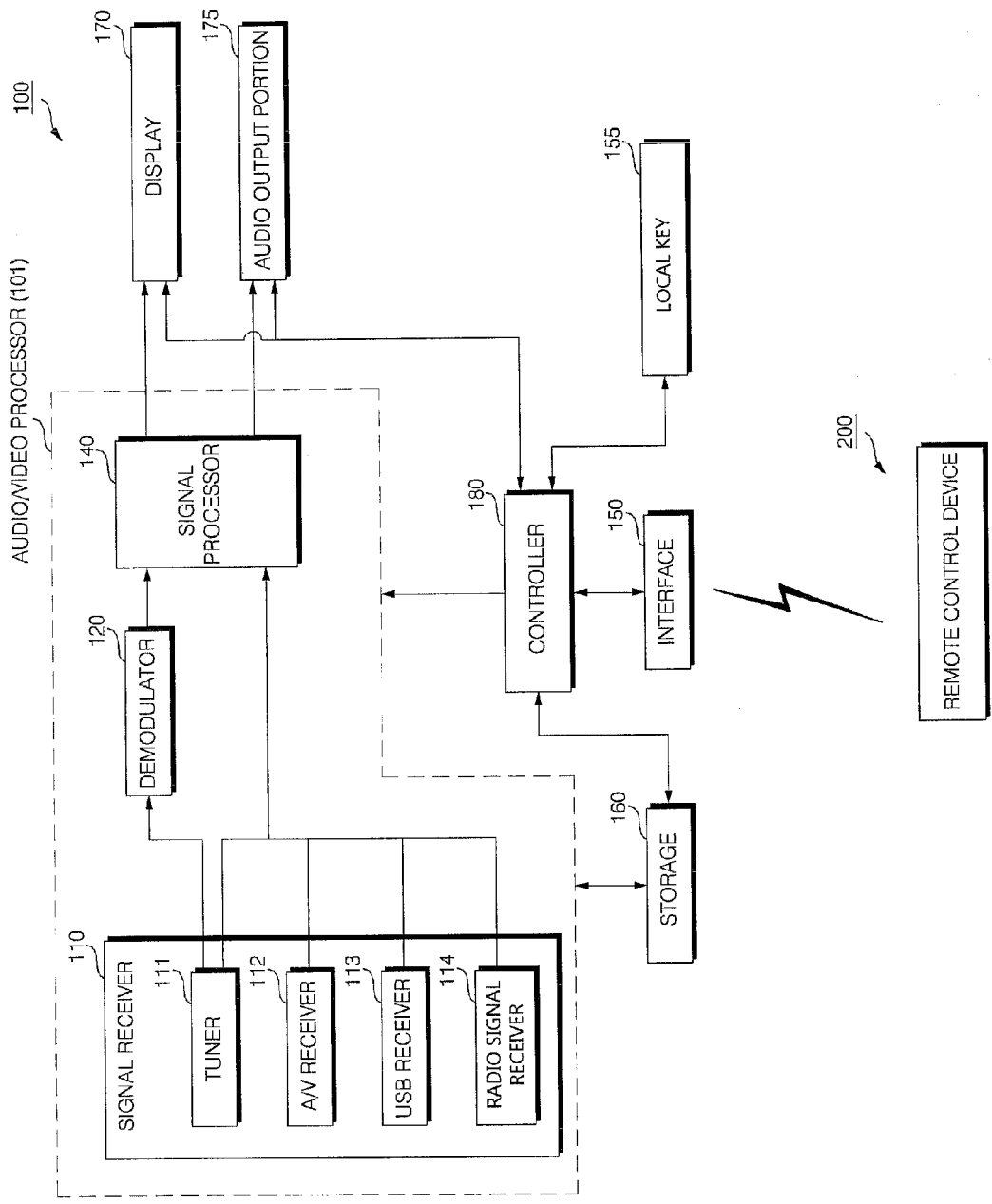
FIG. 1 is a block diagram of an image display device according to an exemplary embodiment of the present invention.

FIG. 1 is a block diagram of an image display device according to an exemplary embodiment of the present invention. Other embodiments and configurations may also be within the scope of the present invention.

FIG. 1 shows an image display device 100 that may include an audio/video processor 101, an interface 150, a local key 155, a storage 160 (or memory), a display 170, an audio output portion 175 and a controller 180.

The audio/video processor 101 may process a received audio or video signal so as to output audio or video to the audio output portion 175 or the display 170. The audio/video processor 101 may include a signal receiver 110, a demodulator 120 and a signal processor 140. The signal receiver 110 may include a tuner 111, an Audio/Visual (A/V) receiver 112, a Universal Serial Bus (USB) receiver 113 and a radio signal receiver 114.

The tuner 111 may select an RF broadcast signal of a user-selected channel from among a plurality of RF broadcast signals received through an antenna and downconvert the selected RF broadcast signal to an Intermediate Frequency (IF) signal or a baseband audio or video signal. For example, if the selected RF broadcast signal is a digital broadcast signal, the tuner 111 may downconvert the RF broadcast signal to a Digital IF (DIF) signal. If the selected RF broadcast signal is an analog broadcast signal, the tuner 111 may downconvert the RF broadcast signal to an analog baseband video or audio signal (Composite Video Banking Sync (CVBS)/Sound Intermediate Frequency (SIF)). That is, the tuner 111 may process a digital or analog broadcast signal. The analog baseband video or audio signal (CVBS/SIF) may be provided directly to the signal processor 140.

The tuner 111 may receive a single-carrier RF broadcast signal based on Advanced Television System Committee (ATSC) and/or a multi-carrier RF broadcast signal based on Digital Video Broadcasting (DVB).

The image display device 100 may include at least two tuners. Like a first tuner, a second tuner may select an RF broadcast signal of a user-selected channel from among RF broadcast signals received through the antenna and downconvert the selected RF broadcast signal to an IF signal or a baseband video or audio signal.

The second tuner may sequentially select RF signals of all broadcast channels that have been stored by a channel memory function from among received RF broadcast signals and downconvert the selected RF signals to IF signals and/or baseband video or audio signals. The second tuner may perform downconversion of the RF signals of all broadcast channels periodically. The image display device 100 may provide video signals of a plurality of channels downconverted by the second tuner in thumbnails, while displaying the video of a broadcast signal downconverted by the first tuner. The first tuner may downconvert a user-selected main RF broadcast signal to an IF signal and/or a baseband video or audio signal, and the second tuner may select all RF broadcast signals except for the main RF broadcast signal sequentially/periodically and downconvert the selected RF broadcast signals to IF signals and/or baseband video or audio signals.

The demodulator 120 may demodulate the DIF signal received from the tuner 111. For example, if the DIF signal is an ATSC signal, the demodulator 120 may demodulate the DIF signal by 8-Vestigal Side Band (8-VSB). As another example, if the DIF signal is a DVB signal, the demodulator 120 may demodulate the DIF signal by Coded Orthogonal Frequency Division Multiple Access (COFDMA) demodulation.

The demodulator 120 may further perform channel decoding. For the channel decoding, the demodulator 120 may include a Trellis decoder, a deinterleaver and a Reed Solomon decoder for Trellis decoding, deinterleaving and Reed Solomon decoding, respectively.

After the demodulation and channel decoding, the demodulator 120 may output a Transport Stream (TS) signal. A video signal, an audio signal and/or a data signal may be multiplexed in the TS signal. For example, the TS signal may be a Moving Picture Experts Group-2 (MPEG-2) TS having an MPEG-2 video signal and a Dolby AC-3 audio signal multiplexed. More specifically, the MPEG-2 TS may include a 4-byte header and a 184-byte payload.

The TS signal may be provided to the signal processor 140. The signal processor 140 may demultiplex and process the TS signal and output a video signal to the display 170 and an audio signal to the audio output portion 175.

An image display device having at least two tuners may have a similar number of demodulators. Additionally, a demodulator may be separately provided for each of ATSC and DVB.

The signal receiver 110 may connect the image display device 100 to an external device. The external device may be an audio or video output device such as a DVD player, a radio, an audio player, an MP3 player, a camera, a camcorder, a game player, etc. The signal receiver 110 may provide an audio, video and/or data signal received from the external device to the signal processor 140 for processing the video and audio signals in the image display device 100.

In the signal receiver 110, the A/V receiver 112 may include a CVBS port, a component port, a S-video port (analog), a Digital Visual Interface (DVI) port, a High Definition Multimedia Interface (HDMI) port, a Red, Green, Blue (RGB) port, a D-SUB port, an Institute of Electrical and Electronics Engineers (IEEE) 1394 port, an Sony/Phillips Digital InterFace (SPDIF) port, a Liquid HD port, etc. in order to provide audio and video signals received from the external device to the image display device 100. Analog signals received through the CVBS port and the S-video port may be provided to the signal processor 140 after analog-to-digital conversion. Digital signals received through the other input ports may be provided to the signal processor 140 without analog-to-digital conversion.

The USB receiver 113 may receive audio and video signals through the USB port.

The radio signal receiver 114 may connect the image display device 100 to a wireless network. The image display device 100 may access a wireless Internet through the radio signal receiver 114. For connection to the wireless Internet, a communication standard may be used, such as Wireless Local Area Network (WLAN) (Wi-Fi), Wireless Broadband (WiBro), Worldwide Interoperability for Microwave Access (Wimax), High Speed Downlink Packet Access (HSDPA), etc. Further, the radio signal receiver 114 may conduct short-range communications with another electronic device. For example, the radio signal receiver 114 may be networked to another electronic device by a communication standard like Bluetooth, Radio Frequency Identification (RFID), InfraRed Data Association (IrDA), Ultra Wideband (UWB), ZigBee, etc.

The signal receiver 110 may connect the image display device 100 to a set-top box (or similar device). For example, if the set-top box operates for Internet Protocol (IP) TV, the signal receiver 110 may transmit an audio, video and/or data signal received from the IPTV set-top box to the signal processor 140 and a processed signal received from the signal processor 140 to the IP TV set-top box.

The signal processor 140 may demultiplex a received TS signal (e.g. an MPEG-2 TS) into an audio signal, a video signal and a data signal. The signal processor 140 may also process the demultiplexed video signal. For example, if the demultiplexed video signal was coded, the signal processor 140 may decode the video signal. More specifically, if the demultiplexed video signal is an MPEG-2 coded video signal, an MPEG-2 decoder may decode the video signal. If the demultiplexed video signal was coded in compliance with H.264 for Digital Multimedia Broadcasting (DMB) or Digital Video Broadcasting-Handheld (DVB-H), an H.264 decoder may decode the video signal.

The signal processor 140 may control brightness, tint, and/or color for the video signal. The video signal processed by the signal processor 140 may be displayed on the display 170.

The signal processor 140 may also process the demultiplexed audio signal. For example, if the demultiplexed audio signal was coded, the signal processor 140 may decode the audio signal. More specifically, if the demultiplexed audio signal is an MPEG-2 coded audio signal, an MPEG-2 decoder may decode the audio signal. If the demultiplexed audio signal was coded in compliance with MPEG 4 Bit Sliced Arithmetic Coding (BSAC) for terrestrial DMB, an MPEG 4 decoder may decode the audio signal. If the demultiplexed audio signal was coded in compliance with MPEG 2 Advanced Audio Codec (AAC) for satellite DMB or DVB-H, an AAC decoder may decode the audio signal.

The signal processor 140 may control base, treble, and/or volume for the audio signal. The audio signal processed by the signal processor 140 may be provided to the audio output portion 175.

The signal processor 140 may also process the demultiplexed data signal. For example, if the demultiplexed data signal was coded, the signal processor 140 may decode the data signal. The coded data signal may be Electronic Program Guide (EPG) information including broadcasting information such as starts, ends, etc. of broadcast programs of each channel. For example, the EPG information may be ATSC-Program and System Information Protocol (ATSC-PSIP) information in case of ATSC. In case of DVB, the EPG information may include DVB-Service Information (DVB-SI). The ATSC-PSIP information or DVB-SI may be included in the 4-byte header of the above-described TS (i.e., MPEG-2 TS).

The signal processor 140 may perform an On-Screen Display (OSD) function. More specifically, the signal processor 140 may display information graphically or in text on the display 170 based on at least one of the processed video and data signals or a user input signal received through a remote control device 200. The remote control device 200 may also be referred to as a pointing device. The remote control device 200 may be a mobile communication terminal.

The storage 160 (or memory) may store programs for signal processing and control operations of the controller 180 and store processed video, audio and/or data signals.

The storage 160 may temporarily store video, audio and/or data signals received at the signal receiver 110.

The storage 160 may include a storage medium of at least one type of flash memory, hard disk, multimedia card micro type, card-type memory (e.g. Secure Digital (SD) or eXtreme Digital (XD) memory), Random Access Memory (RAM), and Read Only Memory (ROM) (e.g. Electrically Erasable Programmable ROM (EEPROM)). The image display device 100 may reproduce a file stored in the storage 160 (e.g. a moving picture file, a still image file, a music file, a text file, etc.) and provide the reproduced file to the user.

The controller 180 may provide overall control to the image display device 100. The controller 180 may receive a signal from the remote control device 200 via the interface 150. The controller 180 may identify a command input to the remote control device 200 by the received signal and control the image display device 100 based on the command. For example, upon receipt of a predetermined channel selection command from the user, the controller 180 may control the tuner 111 to provide a selected channel through the signal receiver 110. The controller 180 may control the signal processor 140 to process the audio and video signals of the selected channel. The controller 180 may control the signal processor 140 to output user-selected channel information along with the processed audio and video signals to the display 170 and/or the audio output portion 175.

In another example, the user may enter a different-type video and/or audio output command through the remote control device 200. The user may want to view a video signal of a camera or a camcorder received through the USB receiver 113 rather than a broadcast signal. The controller 180 may control the audio/video processor 101 such that an audio or video signal received through the USB receiver 113 of the signal receiver 110 may be processed by the signal processor 140 and output to the display 170 and/or the audio output portion 175.

Besides a command received through the remote control device 200, the controller 180 may identify a user command received through the user input portion 155 provided to the image display device 100 and control the image display device 100 based on the user command. For example, the user may enter an on/off command, a channel switch command, a volume change command, and/or the like for the image display device 100 through the user input portion 155. The local key 155 may include buttons and/or keys formed in the image display device 100. The controller 180 may determine whether the user input portion 155 has been manipulated and control the image display device 100 based on the determination.

Figure 2A:
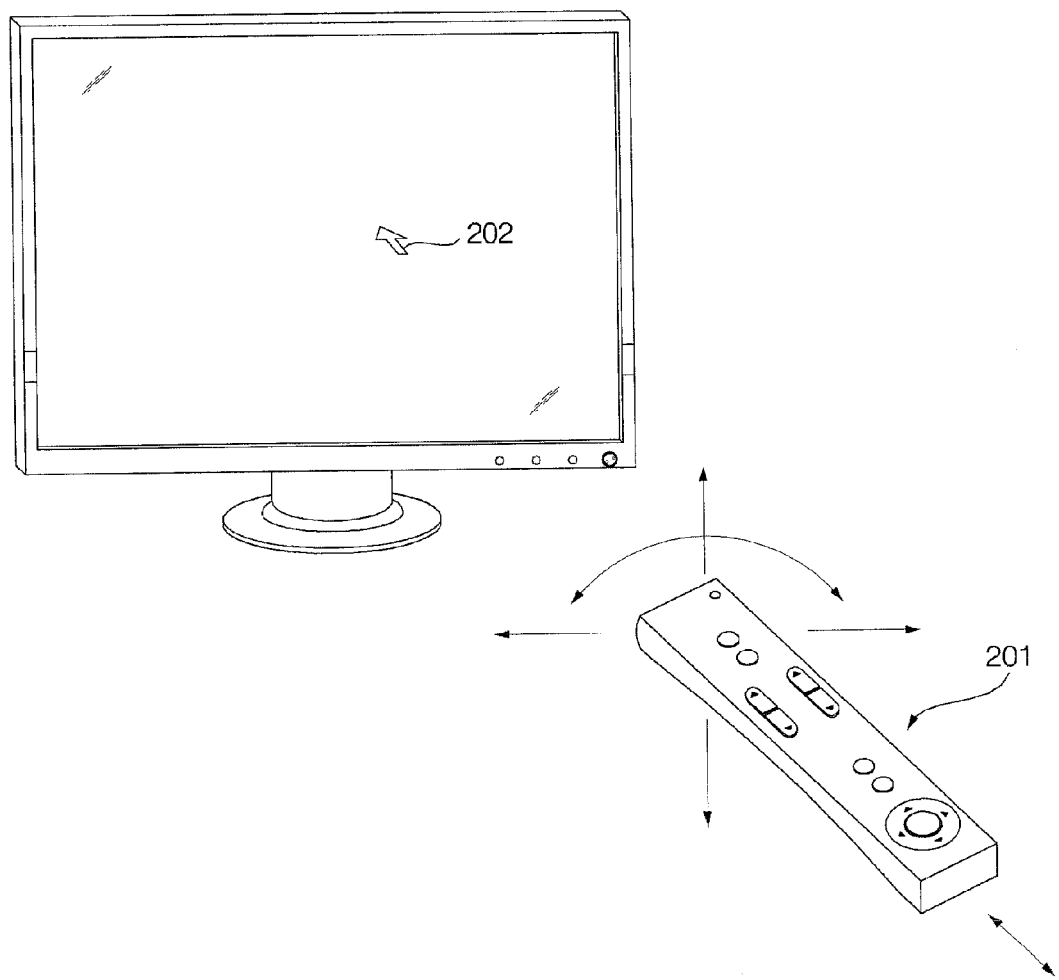
FIGS. 2A and 2B are frontal perspective views of an image display device and a 3-Dimensional (3D) remote controller according to an exemplary embodiment of the present invention.
Figure 2B:
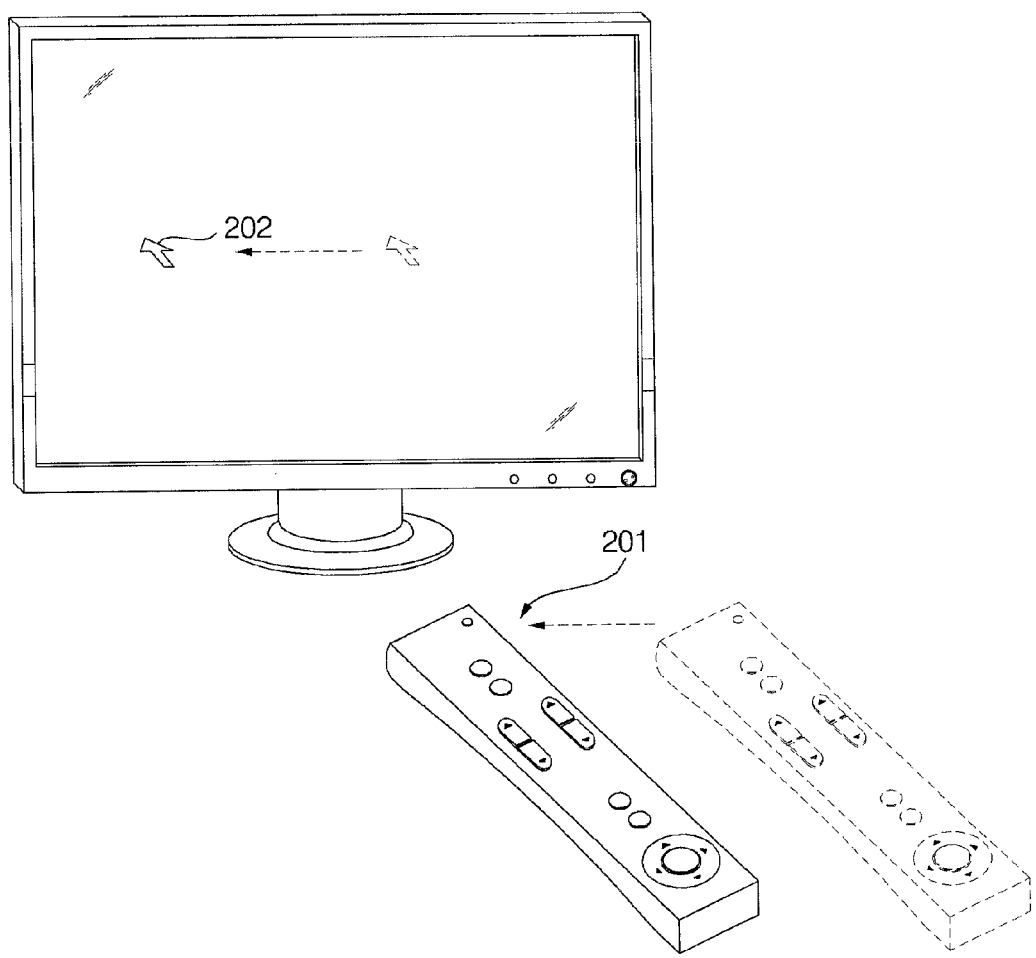

FIGS. 2A and 2B are frontal perspective views of the image display device 100 and a 3D remote controller 201 for entering a command to the image display device 100 according to an exemplary embodiment of the present invention. Other embodiments and configurations may also be within the scope of the present invention.

The 3D remote controller 201 may be a kind of the remote control device 200 for entering a command to the image display device 100. The remote controller 201 may be referred to as a multi-mode pointing device. The remote controller 201 may be a subscriber unit or a mobile communication terminal. The 3D remote controller 201 may transmit and receive signals to and from the image display device 100 in compliance with an RF communication standard. As shown in FIG. 2A, a pointer 202 corresponding to the 3D remote controller 201 may be displayed on the image display device 100.

The user may move the 3D remote controller 201 up, down, left, right, forward or backward, and/or rotate the remote controller 201. The pointer 202 may move on the image display device 100 in correspondence with movement and/or rotation of the 3D remote controller 201.

FIG. 2B illustrates a movement of the pointer 202 on the image display device 100 based on a movement of the remote controller 201. As shown in FIG. 2B, when the user moves the 3D remote controller 201 to the left, the pointer 202 may also move to the left on the image display device 100. The 3D remote controller 201 may include a sensor for sensing movement of the remote controller 201. Information about movement of the 3D remote controller 201 as sensed by the sensor may be provided to the image display device 100. The image display device 100 may determine the movement of the remote controller 201 based on the received information and calculate coordinates of the pointer 202 based on the movement of the remote controller 201.

In FIGS. 2A and 2B, the pointer 202 may move on the image display device 100 in correspondence with an upward, downward, left or right movement and/or rotation of the 3D remote controller 201. The velocity and/or direction of the pointer 200 may correspond to that of the remote controller 201. The pointer 202 may move on the image display device 100 in correspondence with movement of the remote controller 201. A movement of the remote controller 201 may trigger entry of a predetermined command to the image display device 100. If the 3D remote controller 201 moves forward or backward, an image displayed on the image display device 100 may be enlarged and/or contracted (i.e., reduced).

Figure 3:
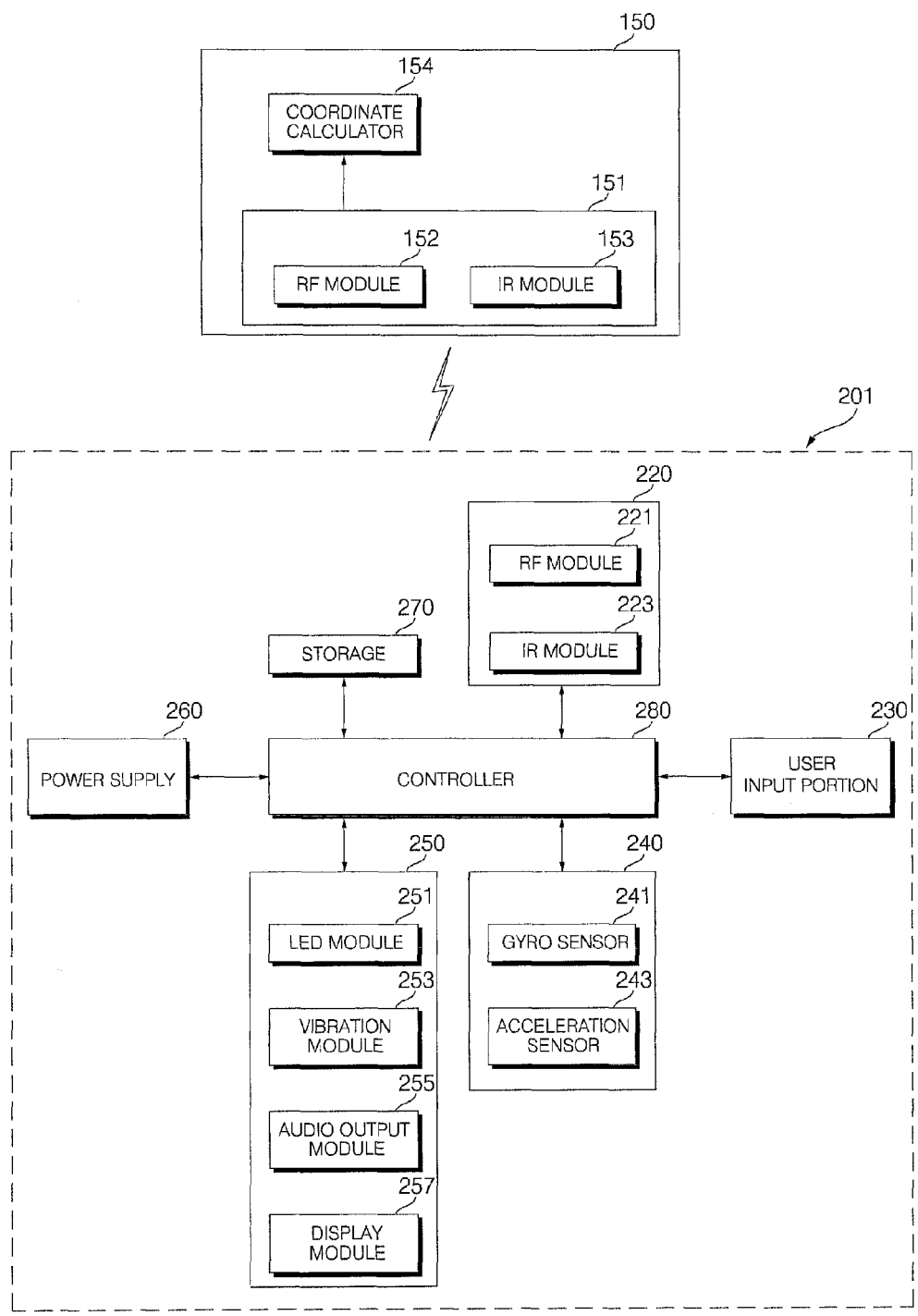
FIG. 3 is a block diagram of a 3D remote controller according to an exemplary embodiment of the present invention.

FIG. 3 is a block diagram of the 3D remote controller 201 and the user interface 150 of the image display device 100 according to an exemplary embodiment of the present invention. Other embodiments and configurations may also be within the scope of the present invention.

The 3D remote controller 201 may include a radio signal transceiver 220, a user input portion 230, a sensor portion 240, an output portion 250, a power supply 260, a storage 270 (or memory) and a controller 280.

The radio signal transceiver 220 may transmit and receive signals to and from the image display device 100. The 3D remote controller 201 may be provided with a radio frequency (RF) module 221 for transmitting and receiving signals to and from the interface 150 of the image display device 100 based on an RF communication standard. The 3D remote controller 201 may include an infrared (IR) module 223 for transmitting and receiving signals to and from the interface 150 of the image display device 100 based on an IR communication standard.

The 3D remote controller 201 may transmit a signal carrying information about an operation of the 3D remote controller 201 to the image display device 100 through the RF module 221. The 3D remote controller 201 may receive a signal from the image display device 100 through the RF module 221. The 3D remote controller 201 may transmit commands associated with power on/off, channel switching, volume change, etc. to the image display device 100 through the IR module 223.

The user input portion 230 may be configured with a keypad and/or buttons. The user may enter a command related to the image display device 100 to the 3D remote controller 201 by manipulating the user input portion 230. If the user input portion 230 includes hard key buttons, the user may enter commands related to the image display device 100 to the 3D remote controller 201 by pushing the hard key buttons. If the user input portion 230 is provided with a touch screen, the user may enter commands related to the image display device 100 to the 3D remote controller 201 by touching soft keys on the touch screen. The user input portion 230 may have a variety of input means the user can manipulate, such as a scroll key, a zog key, etc., although embodiments are not limited thereto.

The sensor portion 240 may include a gyro sensor 241 and/or an acceleration sensor 243. The gyro sensor 241 may sense information about operation of the 3D remote controller 201. For example, the gyro sensor 241 may sense information about operation of the 3D remote controller 201 along x, y and z axes. The acceleration sensor 243 may sense information about velocity of the 3D remote controller 201.

The output portion 250 may output a video or audio signal corresponding to a manipulation of the user input portion 230 or a signal transmitted by the image display device 100. The user may be aware from the output portion 250 whether the user input portion 230 has been manipulated or the image display device 100 has been controlled.

For example, the output portion 250 may include a Light Emitting Diode (LED) module 251 for illuminating when the user input portion 230 has been manipulated or a signal is transmitted to or is received from the image display device 100 through the radio transceiver 220, a vibration module 253 for generating vibrations, an audio output module 255 for outputting audio and/or a display module 257 for outputting video.

The power supply 260 may supply power to the 3D remote controller 201. When the 3D remote controller 201 is kept stationary for a predetermined time period, the power supply 260 may block power (or reduce power) for the 3D remote controller 201. When a predetermined key of the 3D remote controller 201 is manipulated, the power supply 260 may resume power supply.

The storage 270 (or memory) may store a plurality of types of programs required for control or operation of the 3D remote controller 201, and/or application data. When the 3D remote controller 201 wirelessly transmits and receives signals to and from the image display device 100 through the RF module 221, the signal transmission and reception may be carried out in a predetermined frequency band. The controller 280 of the 3D remote controller 201 may store information about a frequency band in which to wirelessly transmit and receive signals to and from the image display device 100 paired with the 3D remote controller 201 and refer to the information.

The controller 280 may provide overall control to the 3D remote controller 201. The controller 280 may transmit a signal corresponding to a predetermined key manipulation on the user input portion 230 or a signal corresponding to an operation of the 3D remote controller 201 sensed by the sensor portion 240 to the interface 150 of the image display device 100 through the radio transceiver 220.

The interface 150 of the image display device 100 may have a radio transceiver 151 for wirelessly transmitting and receiving signals to and from the 3D remote controller 201, and a coordinate calculator 154 for calculating coordinates of the pointer corresponding to an operation of the 3D remote controller 210.

The interface 150 may wirelessly transmit and receive signals to and from the 3D remote controller 201 through the RF module 152. The interface 150 may also receive a signal based on an IR communication standard from the 3D remote controller 201 through the IR module 153.

The coordinate calculator 154 may calculate coordinates (x, y, z) of the pointer 202 to be displayed on the display 170 by correcting handshaking or errors from a signal corresponding to an operation of the 3D remote controller 201 received through the radio transceiver 151.

A signal received from the 3D remote controller 201 through the interface 150 may be provided to the controller 180 of the image display device 100. The controller 180 may identify information about an operation of the 3D remote controller 201 and/or a key manipulation on the 3D remote controller 201 from the received signal and control the image display device 100 based on the information.

In another example, the 3D remote controller 201 may calculate coordinates of the pointer 202 corresponding to its operation and output the coordinates to the interface 150 of the image display device 100. The interface 150 of the image display device 100 may then transmit information about the received coordinates to the controller 180 without correcting handshaking or errors.

FIGS. 1, 2 and 3 illustrate the image display device 100 and the 3D remote controller 201 as the remote control device 200. Components of the image display device 100 and the 3D remote controller 201 may be integrated or omitted, and/or a new component may be added based on their specifications. That is, two or more components may be incorporated into a single component or one component may be configured to be divided into two or more separate components. The function of each block may be presented for illustrative purposes, and does not limit the scope of embodiments.

FIGS. 4 to 8 are flowcharts illustrating methods for pairing or operating a 3D remote controller according to exemplary embodiments of the present invention. Other operations, orders of operations and embodiments may also be within the scope of the present invention.

Figure 4:
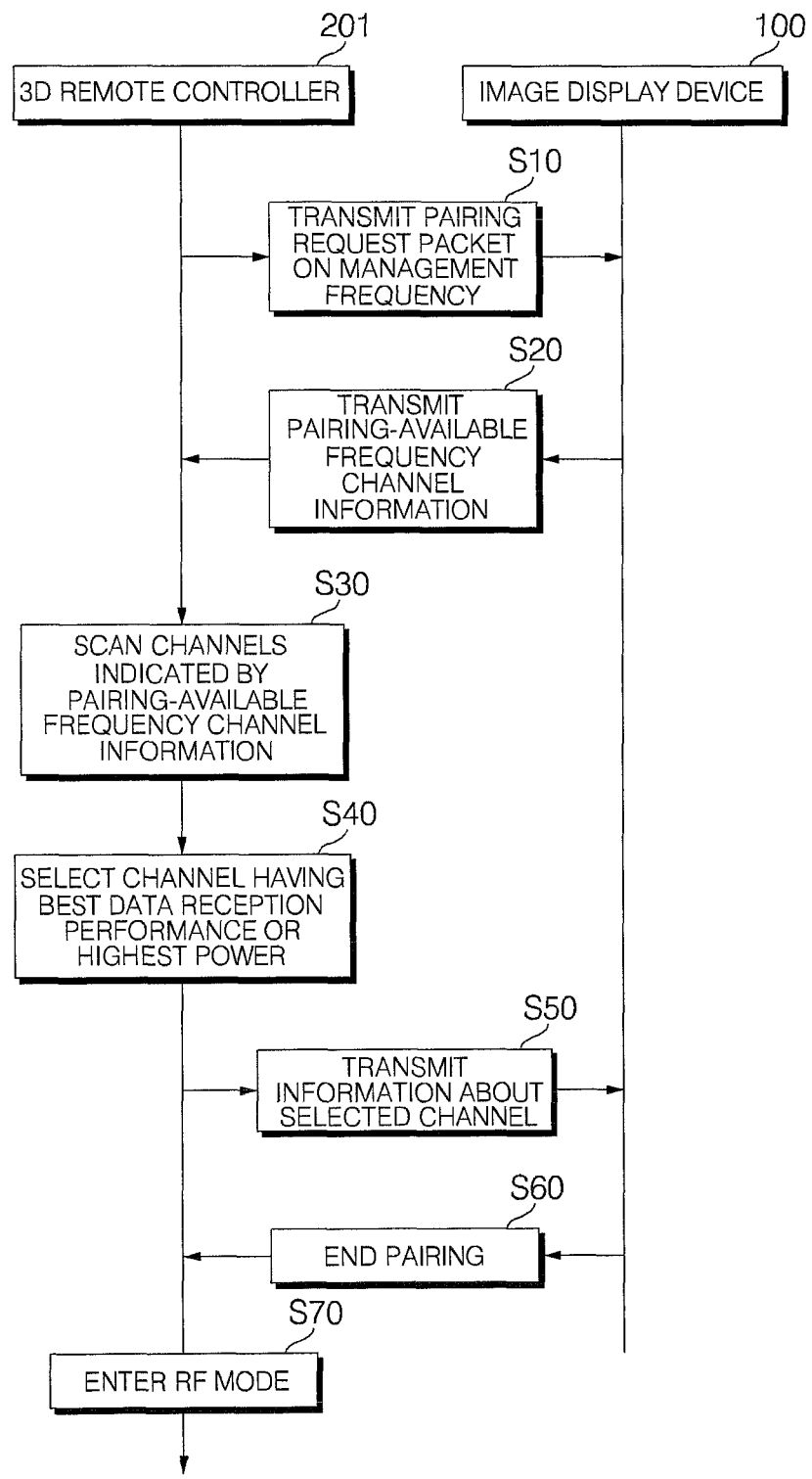
FIGS. 4 to 8 are flowcharts illustrating methods for pairing or operating a 3D remote controller according to exemplary embodiments of the present invention.

FIG. 4 illustrates signal transmission and reception between the 3D remote controller 201 and the image display device 100, when the remote controller 201 and the image display device 100 are paired.

The 3D remote controller 201 may transmit and receive signals to and from the image display device 100 on a management frequency channel (or a prescribed frequency channel). Information about the management frequency channel may be stored in the storage 270 of the 3D remote controller 201 or the storage 160 of the image display device 100. The 3D remote controller 201 may request pairing to the image display device 100 by referencing the management frequency channel information stored in the storage 270. Use of the management frequency channel may enable the 3D remote controller 201 to carry out signal transmission and reception to and from the image display device 100 based on an RF communication standard, before the pairing of the remote controller 201 and the image display device is completed.

Upon reset of the 3D remote controller 201, upon user manipulation of a pairing request button, or upon receipt of a power-on command for the image display device 100, the 3D remote controller 201 may transmit, in operation S10, a signal carrying a pairing request packet to the image display device 100. The controller 280 of the 3D remote controller 201 may transmit the pairing request signal to the image display device 100 through the RF module 152 of the radio transceiver 151 by referring to (or referencing) the management frequency channel information stored in the storage 270.

The image display device 100 may receive the pairing request packet from the 3D remote controller 201 through the RF module 152 of the radio transceiver 151. In operation S20, the image display device 100 may transmit a signal including information about frequency channels available for pairing (i.e., pairing-available frequency channel information) to the 3D remote controller 201 in response to the received pairing request packet. The 3D remote controller 201 may receive the pairing-available frequency channel information through the RF module 221 of the radio transceiver 220. The 3D remote controller 201 may scan the frequency channels indicated by the pairing-available frequency channel information in operation S30.

The 3D remote controller 201 may select a frequency channel (such as an optimum frequency channel) as a pairing frequency channel from among the scanned frequency channels in operation S40. The frequency channel may be a frequency channel in which data is best received or that has a highest power. That is, the 3D remote controller 201 may select a frequency channel having a highest reception sensitivity. The 3D remote controller 201 may also select a frequency channel unused by other external devices as the pairing frequency channel. The 3D remote controller 201 may also select a frequency channel that experiences a least noise or interference as the pairing frequency channel.

The 3D remote controller 201 may transmit information about the selected frequency channel to the image display device 100 in operation S50. The image display device 100 may select (or set) the pairing frequency channel based on the received channel information. The pairing between the 3D remote controller 201 and the image display device 100 may end in operation S60.

In operation S70, the 3D remote controller 201 may enter an RF mode upon completing the pairing. The RF mode may be a mode where signals are transmitted and received between the 3D remote controller 201 and the image display device 100 in compliance with the RF communication standard. If information about a pairing frequency channel (i.e., pairing frequency channel information) is stored in the storage 270, the controller 280 of the 3D remote controller 201 may determine that it is placed in the RF mode.

The 3D remote controller 201 may be in the RF mode or an IR mode. When the 3D remote controller 201 is in the IR mode, the remote controller 201 may transmit a signal to the IR module 153 of the image display device 100 based on the IR communication standard. Power consumption of the 3D remote controller 201 may be greater in the RF mode than in the IR mode. Therefore, when the 3D remote controller 201 is reset or no button or key manipulation has been made for a predetermined time or longer, the 3D remote controller 201 may enter the IR mode.

The user may control the image display device 100 by the 3D remote controller 201 operating in the IR mode. For example, the user may manipulate a power-on button for the image display device 100 from among buttons of the user input portion 230 of the 3D remote controller 201. The 3D remote controller 201 operating in the IR mode may transmit a power-on signal to the IR module 153 of the image display device 100. Thus, the image display device 100 may be turned on.

When the user keeps the 3D remote controller 201 unused for a prescribed length of time (i.e., a long amount of time), the 3D remote controller 201 may also enter the IR mode. Accordingly, when the user manipulates a predetermined button or key of the user input portion 230 with the 3D remote controller 201 unused for a prescribed amount of time, the 3D remote controller 201 may transmit a signal corresponding to the button or the key to the image display device 100 based on the IR communication standard.

After the IR signal transmission, the 3D remote controller 201 may automatically transmit a pairing request packet to the image display device 100 so that the 3D remote controller 201 is paired with the image display device 100 without the user's manual pairing request.

Upon completion of the pairing, the 3D remote controller 201 may enter the RF mode. In the RF mode, when a predetermined button or key is manipulated in the user input portion 203 or the 3D remote controller 201 moves in a predetermined pattern, the controller 280 of the 3D remote controller 201 may transmit a signal corresponding to the button or the key manipulation or a signal corresponding to the predetermined pattern to the image display device 100 through the RF module 221.

Figure 5:
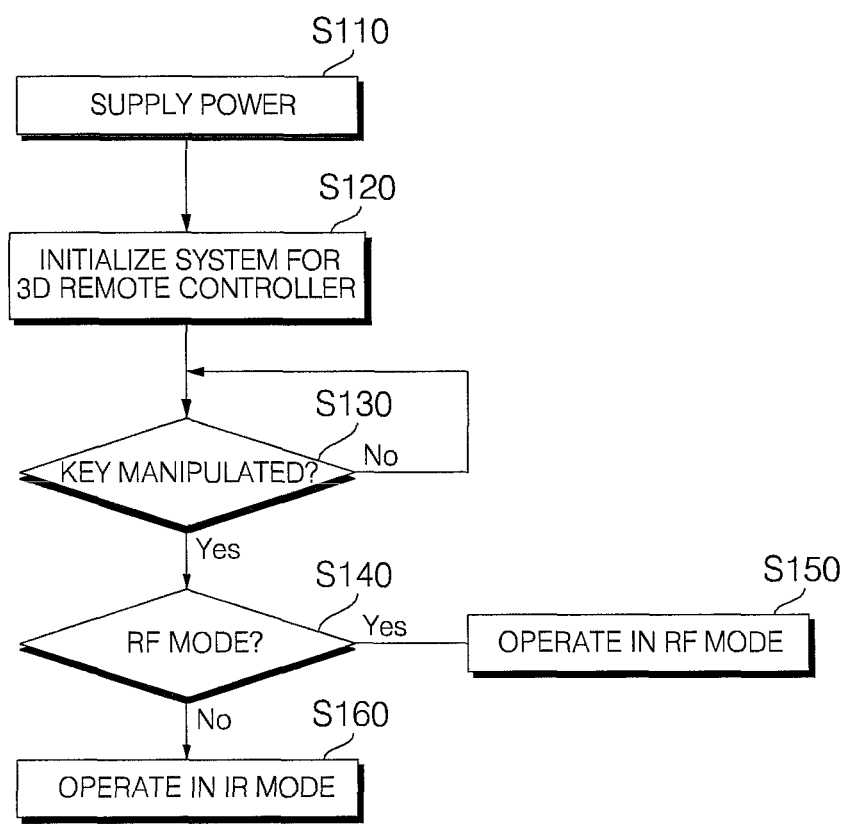

FIG. 5 is a flowchart illustrating a method for operating the 3D remote controller 201 according to an exemplary embodiment of the present invention. FIG. 5 relates to a method for operating the 3D remote controller 201 in case of power-on of the 3D remote controller 201.

When the 3D remote controller 201 is kept stationary for a predetermined amount of time (or longer), or when the user input portion 230 is not manipulated for a predetermined amount of time (or longer), the power supply 260 may block power for the 3D remote controller 201. The power supply 260 may also be blocked while a battery is being replaced for the 3D remote controller 201.

When power supply resumes for the 3D remote controller 201 in operation S110, the 3D remote controller 201 may be system-initialized in operation S120. The system initialization may be a reset of settings stored in the 3D remote controller 201. After the system initialization, the controller 280 may determine whether a button or a key has been manipulated in the user input proportion 230 in operation S130.

Upon sensing the button or the key manipulation in the user input portion 230 and/or upon sensing movement of the 3D remote controller 201 in a predetermined pattern, the controller 280 may determine the current mode of the 3D remote controller 201 in operation S140. The 3D remote controller 201 may be in one of the IR mode or the RF mode, or the remote controller 201 may possibly be in both the IR mode and the RF mode.

If the 3D remote controller 201 is in the RF mode, the controller 280 may perform an RF mode operation in operation S150. That is, the controller 280 may transmit a signal corresponding to the manipulated button or key or a signal corresponding to movement of the 3D remote controller 201 to the image display device 100 based on the RF communication standard. In the RF mode, the 3D remote controller 201 may transmit and receive signals to and from the image display device 100 through the RF module 221.

On the other hand, when the 3D remote controller 201 is in the IR mode, the controller 280 may perform an IR mode operation in operation S160. That is, the controller 280 may transmit a signal corresponding to the manipulated button or key or a signal corresponding to movement of the 3D remote controller 201 to the image display device 100 based on the IR communication standard. In the IR mode, the 3D remote controller 201 may transmit and receive signals to and from the image display device 100 through the IR module 223.

In the presence of pairing frequency channel information in the storage 270, the controller 280 may determine that the 3D remote controller 201 is in the RF mode.

If the 3D remote controller 201 is in the IR mode, the controller 280 may request pairing to the image display device 100 after or during signal transmission to the image display device 100 through the IR module 223. Upon user manipulation of a pairing request button from the buttons or keys of the user input portion 230, the controller 280 may transmit a signal carrying a pairing request packet to the image display device 100 on a management frequency channel (or a prescribed frequency channel).

Figure 6:
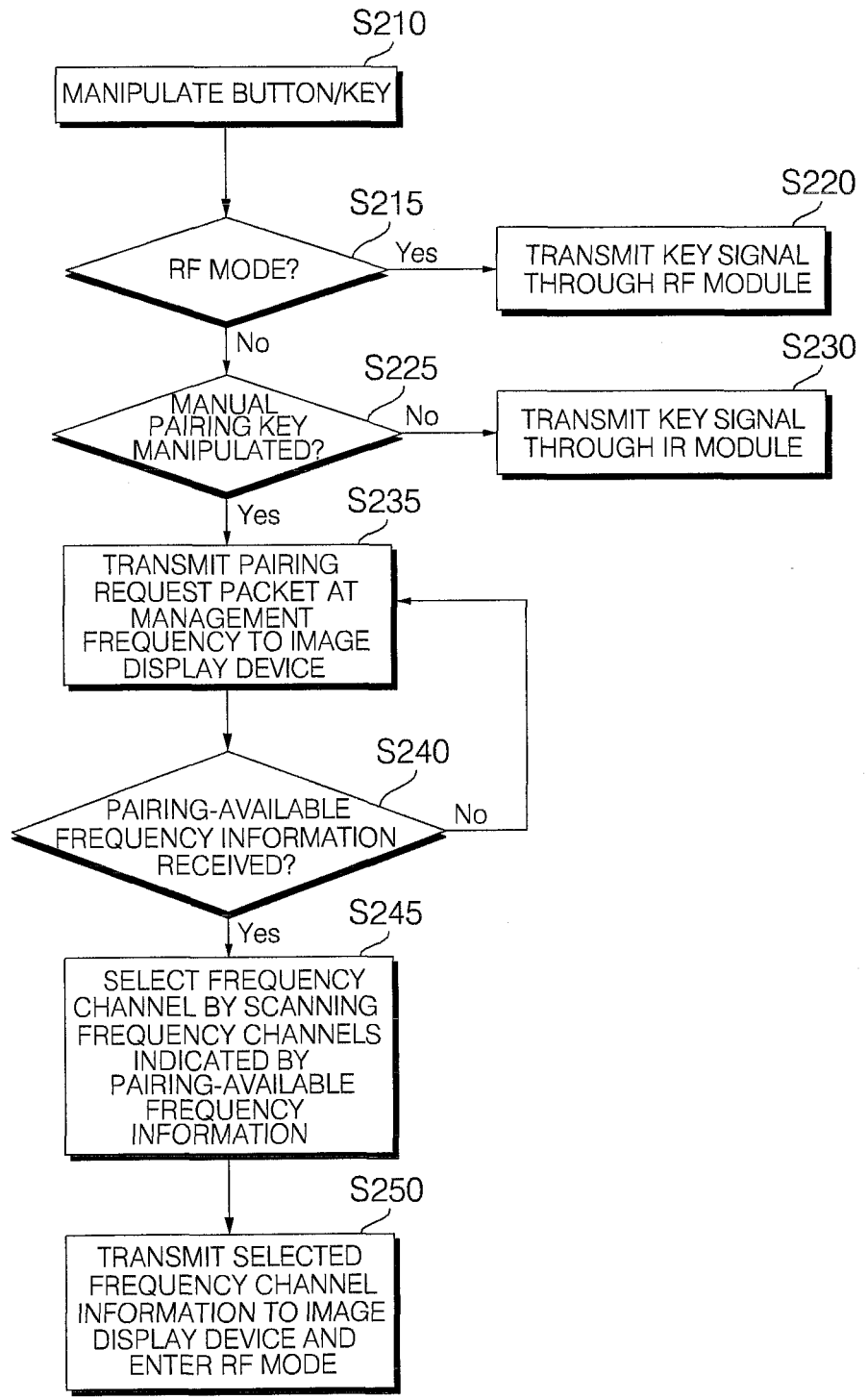

FIG. 6 is a flowchart illustrating a method for operating the 3D remote controller according to an exemplary embodiment of the present invention. FIG. 6 relates to a method for manually pairing the 3D remote controller 201 to the image display device 100 when a user manipulates a pairing request button in the user input portion 230 of the 3D remote controller 201.

As shown in FIG. 6, when the user manipulates a button in the user input portion 230 of the 3D remote controller 201 in operation S210, the controller 280 may determine in operation S215 whether the 3D remote controller 201 is currently in the RF mode.

If the remote controller 201 is in the RF mode, the controller 280 may transmit a signal to the image display device 100 through the RF module 221. The transmitted signal may comply with the RF communication standard and correspond to the user-manipulated button or key. When a command may be entered to the image display device 100 by moving the 3D remote controller 201 in a predetermined pattern, the signal transmitted to the image display device 100 through the RF module 221 may correspond to the movement pattern of the 3D remote controller 201.

When the 3D remote controller 201 transmits a signal to the image display device 100 through the RF module 221, the image display device 100 may receive the signal through the RF module 152. Upon receipt of the signal from the 3D remote controller 201, the image display device 100 may transmit a signal carrying a response packet to the 3D remote controller 201.

If the 3D remote controller 201 has not received the response packet from the image display device 100, the remote controller 201 may attempt transmission a few more times, considering that the signal transmission has been failed. When the 3D remote controller 201 has not received the response packet from the image display device 100 within a predetermined time or within a predetermined number of transmissions, the remote controller 201 may enter the IR mode, considering that pairing with the image display device 100 has been terminated. In the IR mode, the 3D remote controller 201 may transmit a signal corresponding to a manipulated button or key or a signal corresponding to its operation to the image display device 100 based on the IR communication standard.

If the 3D remote controller 201 is currently in the IR mode, the controller 280 may determine whether the manipulated button or key is for a manual pairing request command in operation S225. If the user moves the 3D remote controller 201 in a predetermined pattern, the controller 280 may determine whether the predetermined pattern is for the manual pairing request command.

If the manipulated button or key does not correspond to the manual pairing request command, the controller 280 may transmit a signal corresponding to the manipulated button or key to the image display device 100 through the IR module 223. The signal transmitted through the IR module 223 may comply with the IR communication standard. When the user moves the 3D remote controller 201 in the predetermined pattern, the controller 280 may transmit a signal corresponding to the predetermined pattern to the image display device 100 through the IR module 223.

If the manipulated button or key, or the predetermined pattern corresponds to the manual pairing request command, the controller 280 may transmit a signal carrying a pairing request packet to the image display device on a management frequency channel (or prescribed frequency channel) in operation S235. When transmitting the pairing request pairing packet, the controller 280 may reference management frequency channel information stored in the storage 270 and transmit the pairing request packet on a referenced management frequency channel. The controller 280 may control the RF module 221 to transmit the pairing request packet according to the RF communication standard.

The controller 280 may receive pairing-available frequency channel information from the image display device 100 in operation S240. If the controller 280 does not receive the pairing-available frequency channel information, the controller 280 may retransmit the pairing request packet a plurality of times. If the controller 280 does not receive the pairing-available frequency channel information despite repeated transmissions of the pairing request packet, the controller 280 may transition the 3D remote controller 201 to the IR mode. In the IR mode, the 3D remote controller 201 may transmit a signal complying with the IR communication standard to the image display device 100 through the IR module 233.

Upon receipt of the pairing-available frequency channel information from the image display device 100, the controller 280 may scan frequency channels indicated by the pairing-available frequency channel information and select a frequency channel for pairing in operation S245. The selected frequency channel may have a highest reception sensitivity from among the scanned frequency channels.

In operation S250, the controller 280 may transmit information about the selected frequency channel to the image display device 100 and enter the RF mode. In the RF mode, the 3D remote controller 201 and the image display device 100 may communicate with each other in compliance with the RF communication standard.

The pairing request button may be separately provided in the user input portion 230. When the user manipulates a predetermined button of the user input portion 230 in a predetermined pattern, a pairing request command may be entered to the 3D remote controller 201. When the sensor portion 240 for sensing a movement is provided to the 3D remote controller 201 and the user moves the 3D remote controller 201 in a predetermined pattern, the pairing request command may be entered to the 3D remote controller 201.

Figure 7:
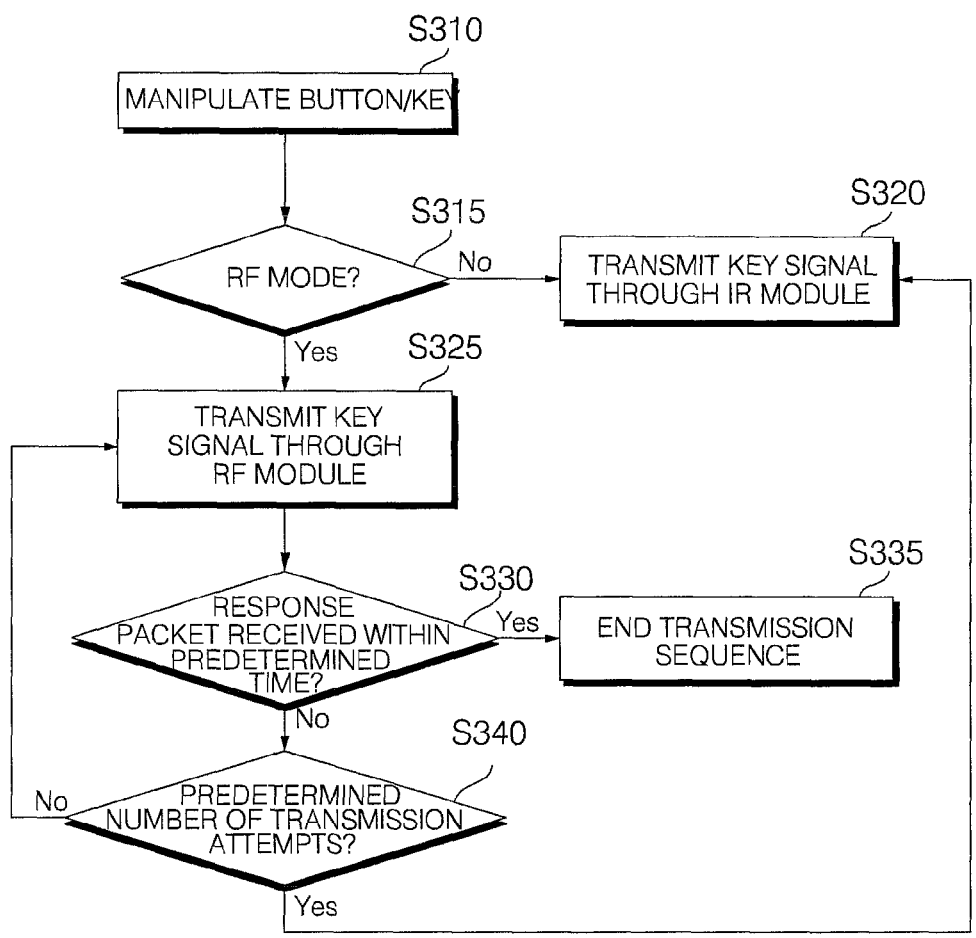

FIG. 7 is a flowchart illustrating a method for operating the 3D remote controller according to an exemplary embodiment of the present invention. FIG. 7 relates to an operation method for the 3D remote controller 201 in the RF mode.

As shown in FIG. 7, when the user manipulates a predetermined button or key in the user input portion 230 or moves the 3D remote controller 201 in a predetermined pattern in operation S310, the controller 280 of the 3D remote controller 201 may determine in operation S315 whether the 3D remote controller 201 is currently in the RF mode.

If the 3D remote controller 201 is determined to not be in the RF mode, which may mean that it is in the IR mode, the controller 280 may transmit a signal to the image display device 100 through the IR module 223 in operation S320. In this case, when a pairing request command has been entered by the manipulated button or key or movement of the 3D remote controller 201, the 3D remote controller 201 may operate in the procedure shown in FIG. 6.

If the 3D remote controller 201 is in the RF mode, the controller 280 may transmit, in operation S325, a signal to the image display device 100 through the RF module 221 according to the RF communication standard. The transmitted signal may correspond to the user-manipulated button or key or movement of the 3D remote controller 201.

In operation S330, the controller 280 may monitor receipt of a response packet (or corresponding signal) from the image display device 100 within a predetermined amount of time. Upon receipt of the response packet through the RF module 221 within the predetermined amount of time, the controller 280 may end a transmission sequence in operation S335.

If the controller 280 does not receive the response packet within the predetermined amount of time, the controller 280 may transmit the signal corresponding to the manipulated button or key or movement of the 3D remote controller 201a predetermined number of times to the image display device 100 through the RF module 221 in operations S340 and S325. When the controller 280 does not receive the response packet from the image display device 100 despite the repeated signal transmissions, the 3D remote controller 201 may transition to the IR mode.

In the IR mode, the 3D remote controller 201 may transmit, in operation S320, a signal corresponding to a manipulated button or key or signal corresponding to its movement to the image display device 100 through the IR module 223. The controller 280 may pair the 3D remote controller 201 with the image display device 100 by transmitting a pairing request packet to the image display device 100.

Figure 8:
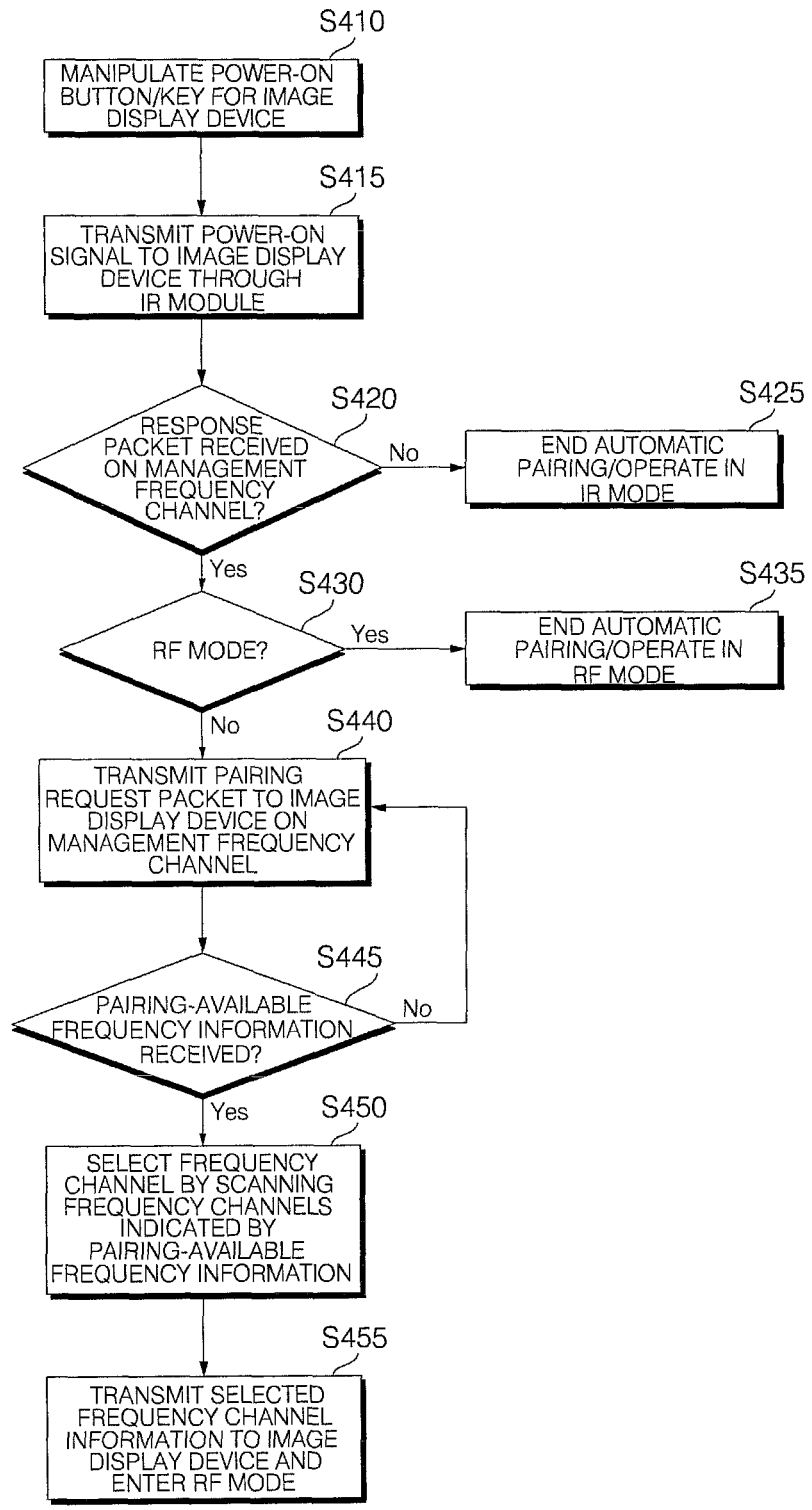

FIG. 8 is a flowchart illustrating a method for operating the 3D remote controller according to an exemplary embodiment of the present invention. More specifically, FIG. 8 relates to an operation method for the 3D remote controller 201 when the image display device 100 is power-on by manipulating a predetermined button or key of the 3D remote controller 201. The user may turn on the image display device 100 by manipulating a power button for the image display device 100 on the 3D remote controller 201. The 3D remote controller 201 may transmit a received power-on command signal to the image display device 100 through the IR module 223. When the image display device 100 is powered-on, the 3D remote controller 201 may complete pairing and then enter the RF mode. In the RF mode, the 3D remote controller 201 may communicate with the image display device 100 through the RF module 221.

As shown in FIG. 8, when the user manipulates a predetermined button or key in the user input portion 230 or moves the 3D remote controller 201 in a predetermined pattern, a power-on command for the image display device 100 may be entered to the 3D remote controller 201 in operation S410.

The controller 280 may transmit a signal including a power-on key signal to the image display device 100 through the IR module 223 in operation S415. Upon power-on, the image display device 100 may transmit a signal carrying a response packet to the 3D remote controller 201 on a management frequency channel (or a prescribed frequency channel). In operation S420, the controller 280 may monitor receipt of the response packet through the RF module 221 after transmission of the power-on signal through the IR module 223. The response packet may be transmitted and received on the management frequency channel between the 3D remote controller 201 and the image display device 100 based on the RF communication standard. Therefore, even before pairing between the 3D remote controller 201 and the image display device 100, RF signal transmission and reception may be possible.

If the controller 280 has not received the response packet on the management frequency channel, an automatic pairing may be terminated and the 3D remote controller 201 may enter the IR mode in operation S425. On the other hand, upon receipt of the response packet, the controller 280 may determine whether the 3D remote controller 201 is currently in the RF mode in operation S430. If the current mode is the RF mode, the automatic pairing may be terminated and the 3D remote controller 201 may operate in the RF mode in operation S435. The RF mode may be determined when the controller 280 detects pairing frequency channel information in the storage 270.

If the 3D remote controller 201 is determined to not be in the RF mode, the controller 280 may transmit a signal carrying a pairing request packet on the management frequency channel to the image display device 100 in operation S440. The signal carrying the pairing request packet may be transmitted to the RF module 152 of the image display device 100 through the RF module 221 of the 3D remote controller 201. Upon power-on of the image display device 100, the pairing request packet may be automatically transmitted to the image display device 100 even though the user does not manipulate the predetermined button or key, or the user does not move the 3D remote controller 201. Therefore, pairing may be carried out between the 3D remote controller 201 and the image display device 100 without being noticed to the user.

Upon receipt of pairing-available frequency channel information from the image display device 100 in operation S445, the controller 280 may scan frequency channels indicated by the pairing-available frequency channel information and select a frequency channel for pairing in operation S450. In operation S455, the controller 280 may transmit information about the selected frequency channel to the image display device 100 and enter the RF mode. In the RF mode, the 3D remote controller 201 and the image display device 100 may communicate with each other on the selected frequency channel in compliance with the RF communication standard.

Figure 9A:
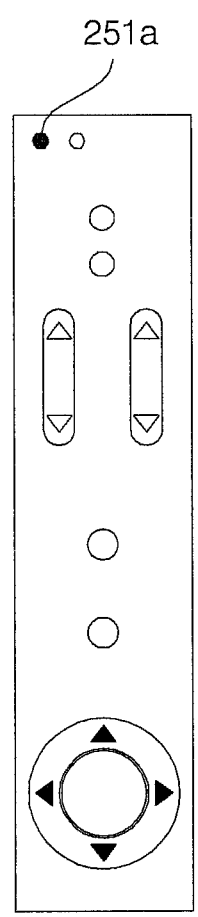
FIGS. 9A and 9B illustrate an exterior of a 3D remote controller according to an exemplary embodiment of the present invention.
Figure 9B:
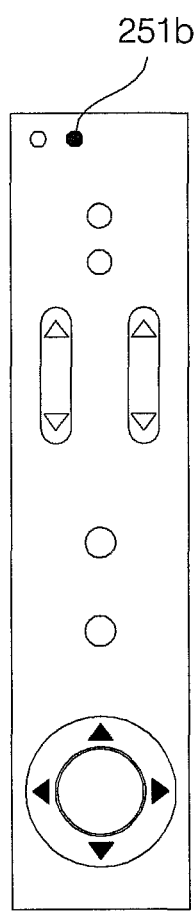

FIGS. 9A and 9B illustrate an exterior of a 3D remote controller according to an exemplary embodiment of the present invention. Other embodiments and configurations may also be within the scope of the present invention.

The 3D remote controller 201 may indicate its current mode through an LED module 251. For example, when the 3D remote controller 201 is operating in the IR mode, the controller 280 may turn on a first LED 251a in the LED module 251, as shown in FIG. 9A. In another example, when the 3D remote controller 201 is operating in the RF mode, the controller 280 may turn on a second LED 251b in the LED module 251, as shown in FIG. 9B.

The user may recognize whether the 3D remote controller 201 has been paired by an illumination state of the first and second LEDs 251a and 251b.

Figure 10A:
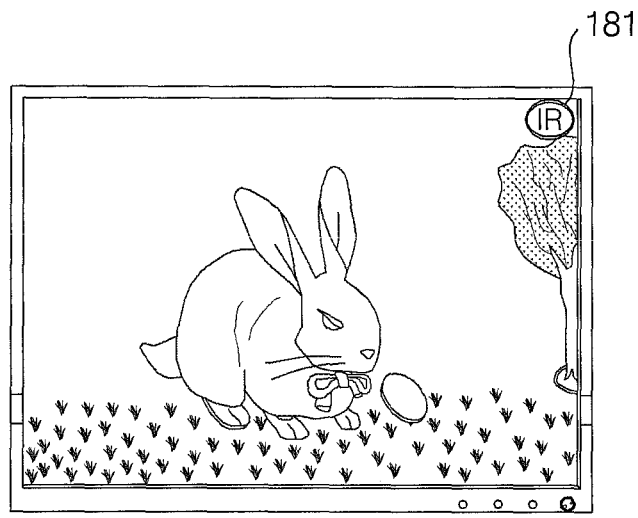
FIGS. 10A and 10B illustrate screens having images displayed in an image display device according to an exemplary embodiment of the present invention.
Figure 10B:
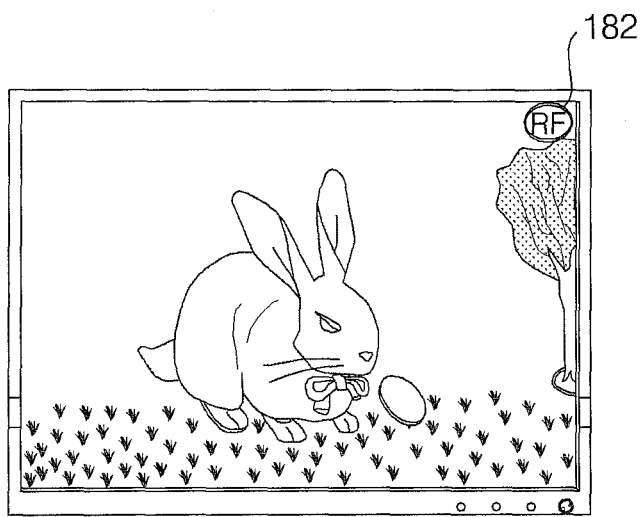

FIGS. 10A and 10B illustrate screens having images displayed in an image display device according to an exemplary embodiment of the present invention. Other embodiments and configurations may also be within the scope of the present invention.

The image display device 100 controlled by the 3D remote controller 201 may represent information about a mode of the 3D remote controller 201. For example, as shown in FIG. 10A, when the 3D remote controller 201 is in the IR mode, the controller 180 of the image display device 100 may display an IR icon 181 on the display 170. In another example, when the 3D remote controller 201 is in the RF mode, the controller 180 of the image display device 100 may display an RF icon 182 on the display 170.

The user may be aware of the mode of the 3D remote controller 201 by the IR icon 181 or the RF icon 182.

Embodiments may enable convenient, simple pairing between an image display device and a remote control device (such as a mobile communication terminal). The pairing may be carried out without being noticed to a user. Therefore, a user's manual pairing may not be performed before using the remote control device. Further, the remote control device may communicate with the image display device according to at least two communication standards. Therefore, even when signal transmission is not available based on one communication standard, the remote control device may transmit a signal to the image display device according to another communication standard.

Embodiments may also be embodied as processor-readable codes on a processor-readable recording medium provided in an image display device. The processor-readable recording medium may be any data storage device that can store data that can thereafter be read by a process. Examples of the processor-readable recording medium may include, but are not limited to, optical data storages such as ROM, RAM, CD-ROMs, magnetic tapes, floppy disks, optical data storage devices, and carrier waves (such as data transmission through the Internet via wired or wireless transmission paths). The processor-readable recording medium may also be distributed over network-coupled computer systems so that the processor-readable code is stored and executed in a distributed fashion.

Embodiments of the present invention may provide a method for readily pairing a remote control device (or a multi-mode pointing device) with an image display device.

A method may be provided for operating a remote control device (or a multi-mode pointing device) that transmits and receives signals to and from an image display device in compliance with at least two communication standards.

A method may be provided for pairing a 3D remote controller (or a multi-mode pointing device) that includes transmitting a pairing request signal to an image display device on a management frequency channel, receiving a signal carrying pairing-available frequency information from the image display device in response to the pairing request signal, and setting a predetermined frequency channel from among frequency channels indicated by the received pairing-available frequency information as a pairing frequency channel.

A method may be provided for operating a 3D remote controller (or a multi-mode pointing device) that includes determining whether a button has been manipulated, determining whether the 3D remote controller is currently in an RF mode and/or an IR mode, and transmitting a signal corresponding to the manipulated button to an image display device according to a communication standard corresponding to the determined mode.

A 3D remote controller (or a multi-mode pointing device) may be provided for transmitting and receiving signals to and from an image display device. The 3D remote controller may include a radio transceiver, a storage (or memory) for storing management frequency channel information, and a controller for controlling the radio transceiver to transmit a pairing request signal to the image display device on a management frequency channel, for receiving a signal carrying pairing-available frequency information from the image display device through the radio transceiver in response to the pairing request signal, and for setting a predetermined frequency channel from among frequency channels indicated by the received pairing-available frequency information as a pairing frequency channel.

A 3D remote controller (or a multi-mode pointing device) may include a user input portion having buttons, a radio transceiver, and a controller for determining whether the 3D remote controller is currently in an RF mode or an IR mode, and for controlling the radio transceiver to transmit a signal corresponding to the manipulated button to an image display device based on a communication standard corresponding to the determined mode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for operating a pointing device comprising a radio signal transceiver, an input portion including a power-on button, and a sensor portion including a gyro sensor and an acceleration sensor, the method comprising:
    receiving, at the pointing device, a power on input from the power-on button;
    transmitting at least one infrared (IR) signal to a television in response to the power on input;
    receiving, at the pointing device, a signal from the television, wherein the signal is received from the television in response to the television powering on based on the at least one infrared (IR) signal, and the signal is received through a radio frequency (RF) communication standard;
    transmitting a pairing request signal in response to the received signal from the television;
    receiving information from the television, the received information including information of pairing-available frequency channel of a plurality of frequency channels;
    selecting at least one of a frequency channel as a pairing frequency channel based on the received information from the television;
    operating the pointing device in an RF mode after pairing between the pointing device and the television based on the selected frequency channel;
    receiving signals sensed from the gyro sensor and the acceleration sensor; and
    transmitting a RF signal to the television using the selected frequency channel, wherein the RF signal includes information regarding movement of the pointing device corresponding to the signals received from the gyro sensor and the acceleration sensor.

2. The method according to claim 1, wherein selecting the at least one of the frequency channels comprises scanning the frequency channels indicated by the received information of the plurality of frequency channels and selecting the at least one of the frequency channels from the scanned frequency channels as the pairing frequency channel.

3. The method according to claim 1, wherein when the pairing frequency channel is selected, the pointing device is in an RF mode.

4. The method according to claim 1, wherein the information regarding movement of the pointing device includes information regarding operation of the pointing device along x, y and z axes, and information regarding velocity of the pointing device.

5. The method according to claim 1, further comprising displaying information regarding a connection between the pointing device and the television.

6. The method according to claim 1, further comprising:
when the pointing device moves in a first pattern, transmitting a signal corresponding to a button or a key manipulation to the television as the RF signal.

7. The method according to claim 1, wherein upon power-on of the television, the pairing request signal is transmitted to the television in case that a predetermined button or key is not manipulated, or the pointing device is not moved.

8. The method according to claim 1, further comprising:
upon receipt of the received signal from the television, determining whether the pointing device is currently in an RF mode;
the transmitting includes:
when the pointing device is not currently in an RF mode, transmitting a pairing request signal in response to the received signal from the television.

9. A method for operating a pointing device comprising a radio signal transceiver, an input portion including a power-on button, and a sensor portion including a gyro sensor and an acceleration sensor, the method comprising:
receiving, at the pointing device, a first input from the power-on button;
transmitting an infrared (IR) signal to a television in response to a power on input;
receiving, at the pointing device, a signal from the television, wherein the signal is received from the television in response to the television powering on based on the at least one infrared (IR) signal, and the signal is received through a radio frequency (RF) communication standard;
transmitting a pairing request signal to the television in response to the signal from the television;
receiving information from the television, the received information including information of pairing-available frequency channel of a plurality of frequency channels;
selecting at least one of a frequency channel as a pairing frequency channel based on the received information from the television;
operating the pointing device in an RF mode after pairing between the pointing device and the television based on the selected frequency channel;
receiving signals sensed from the gyro sensor and the acceleration sensor; and
transmitting a RF signal to the television using the selected frequency channel;
wherein the RF signal includes information regarding movement of the pointing device corresponding to the signals received from the gyro sensor and the acceleration sensor.

10. The method according to claim 9, further comprising:
transitioning the pointing device to an IR mode when a response signal is not received within a predetermined time after transmitting the RF signal or within a predetermined number of signal transmissions.

11. The method according to claim 10, further comprising:
transmitting a signal corresponding to a manipulated button when the pointing device is transitioned to the IR mode.

12. The method of claim 9, further comprising:
indicating the mode of the pointing device.

13. The method according to claim 9, wherein the information regarding movement of the pointing device includes information regarding operation of the pointing device along x, y and z axes, and information regarding velocity of the pointing device.

14. The method according to claim 9, further comprising displaying information regarding a connection between the pointing device and the television.

15. The method according to claim 9, further comprising:
upon receipt of the received signal from the television, determining whether the pointing device is currently in an RF mode;
the transmitting includes:
when the pointing device is not currently in an RF mode, transmitting a pairing request signal in response to the received signal from the television.

16. A pointing device for transmitting and receiving signals, comprising:
a radio signal transceiver;
an input portion including a power-on button;
a sensor portion including a gyro sensor and an acceleration sensor;
a storage for storing frequency channel information; and
a controller configured to:
transmit at least one infrared (IR) signal to a television in response to a first input from the power-on button,
receive a signal from the television, wherein the signal is received from the television in response to the television powering on based on the at least one infrared (IR) signal, and the signal is received through a radio frequency (RF) communication standard;
transmit a pairing request signal in response to the received signal from the television at the pointing device,
receive information from the television, the received information including information of pairing-available frequency channel of a plurality of frequency channels,
select at least one of a frequency channel as a pairing frequency channel based on the received information from the television,
operate the pointing device in an RF mode after pairing between the pointing device and the television based on the selected frequency channel,
receive signals sensed from the gyro sensor and the acceleration sensor, and
transmit a RF signal to the television using the selected frequency channel, wherein the RF signal includes information regarding movement of the pointing device corresponding to the signals received from the gyro sensor and the acceleration sensor.

17. The pointing device according to claim 16, wherein the controller is configured to transition the pointing device to the IR mode when a response signal is not received within a predetermined time after transmitting the RF signal or within a predetermined number of signal transmissions.

18. The pointing device according to claim 16, wherein when the controller determines that the pointing device is in the IR mode, the controller is configured to determine whether a pairing request button is manipulated, and transmit a pairing request signal on a prescribed frequency channel when the pairing request button is determined to be manipulated.

19. The pointing device according to claim 16, wherein the controller is configured to transmit information regarding movement of the pointing device to the television while the pointing device is operating in the RF mode.

20. The pointing device according to claim 19, wherein the information regarding movement of the pointing device includes information regarding operation of the pointing device along x, y and z axes, and information regarding velocity of the pointing device.

21. The pointing device according to claim 16, wherein when the pointing device moves forward or backward, an image displayed on the television is enlarged or reduced.

22. The pointing device according to claim 16, further comprising a power supply,
wherein when the pointing device is kept stationary for a predetermined time period, the power supply blocks power or reduces power for the pointing device, and
wherein when a predetermined key of the pointing device is manipulated or the pointing device moves, the power supply resumes power supply.

23. The pointing device according to claim 16, wherein power consumption of the pointing device is greater in an RF mode transmitting the RF signal than in the IR mode transmitting the IR signal.

24. The pointing device according to claim 16, when the controller does not receive the pairing-available frequency channel information, the controller is configured to retransmit the pairing request packet a plurality of times.

25. The pointing device according to claim 16, when the pointing device is moved in a predetermined pattern, a pairing request command is entered for transmitting the pairing request signal.

26. The pointing device according to claim 16, wherein the controller is configured to:
upon receipt of the received signal from the television, determine whether the pointing device is currently in an RF mode, and
when the pointing device is not currently in an RF mode, transmit a pairing request signal in response to the received signal from the television.

* * * * *